(12) United States Patent
Kyriazidou et al.

(10) Patent No.: US 7,032,292 B2
(45) Date of Patent: Apr. 25, 2006

(54) METHOD OF MANUFACTURING HIGH Q ON-CHIP INDUCTOR

(75) Inventors: Sissy Kyriazidou, Santa Monica, CA (US); Harry Contopanagos, Santa Monica, CA (US); Reza Rofougaran, Marina Del Ray, CA (US)

(73) Assignee: Broadcom Corporation, Irvine, CA (US)

( * ) Notice: Subject to any disclaimer, the term of this patent is extended or adjusted under 35 U.S.C. 154(b) by 341 days.

(21) Appl. No.: 10/395,568

(22) Filed: Mar. 24, 2003

(65) Prior Publication Data

US 2004/0032314 A1    Feb. 19, 2004

Related U.S. Application Data

(62) Division of application No. 10/087,614, filed on Mar. 1, 2002, now Pat. No. 6,809,623.

(51) Int. Cl.
*H01F 7/06* (2006.01)
*H01F 5/00* (2006.01)
*H01C 10/06* (2006.01)

(52) U.S. Cl. .................. 29/602.1; 29/604; 29/605; 29/606; 29/610.1; 29/838; 336/200; 338/92

(58) Field of Classification Search ............. 29/602.1, 29/604, 605, 606, 838, 610.1; 336/200, 180, 336/223, 232, 83; 338/92, 131, 260, 266, 338/307
See application file for complete search history.

(56) References Cited

U.S. PATENT DOCUMENTS

| | | | | |
|---|---|---|---|---|
| 3,360,720 A | * | 12/1967 | Mennie | 324/660 |
| 4,395,659 A | * | 7/1983 | Aoike et al. | 315/209 R |
| 5,239,402 A | * | 8/1993 | Little et al. | 398/202 |
| 5,386,206 A | * | 1/1995 | Iwatani et al. | 336/200 |

* cited by examiner

*Primary Examiner*—A. Dexter Tugbang
*Assistant Examiner*—Tai Van Nguyen
(74) *Attorney, Agent, or Firm*—Garlick Harrison & Markison LLP; Timothy W. Markison

(57) ABSTRACT

A high Q on-chip inductor includes a primary winding and an auxiliary winding that is coupled to receive a proportionally opposite representation of an input of the primary winding. Further, the auxiliary winding has an admittance that is greater than the admittance of the primary winding thereby yielding an asymmetry in the admittances. As such, a push/pull mechanism is obtained in a 2-port system (e.g., $1^{st}$ and $2^{nd}$ nodes of the primary winding) that produces a large Q factor for an on-chip inductor.

15 Claims, 7 Drawing Sheets

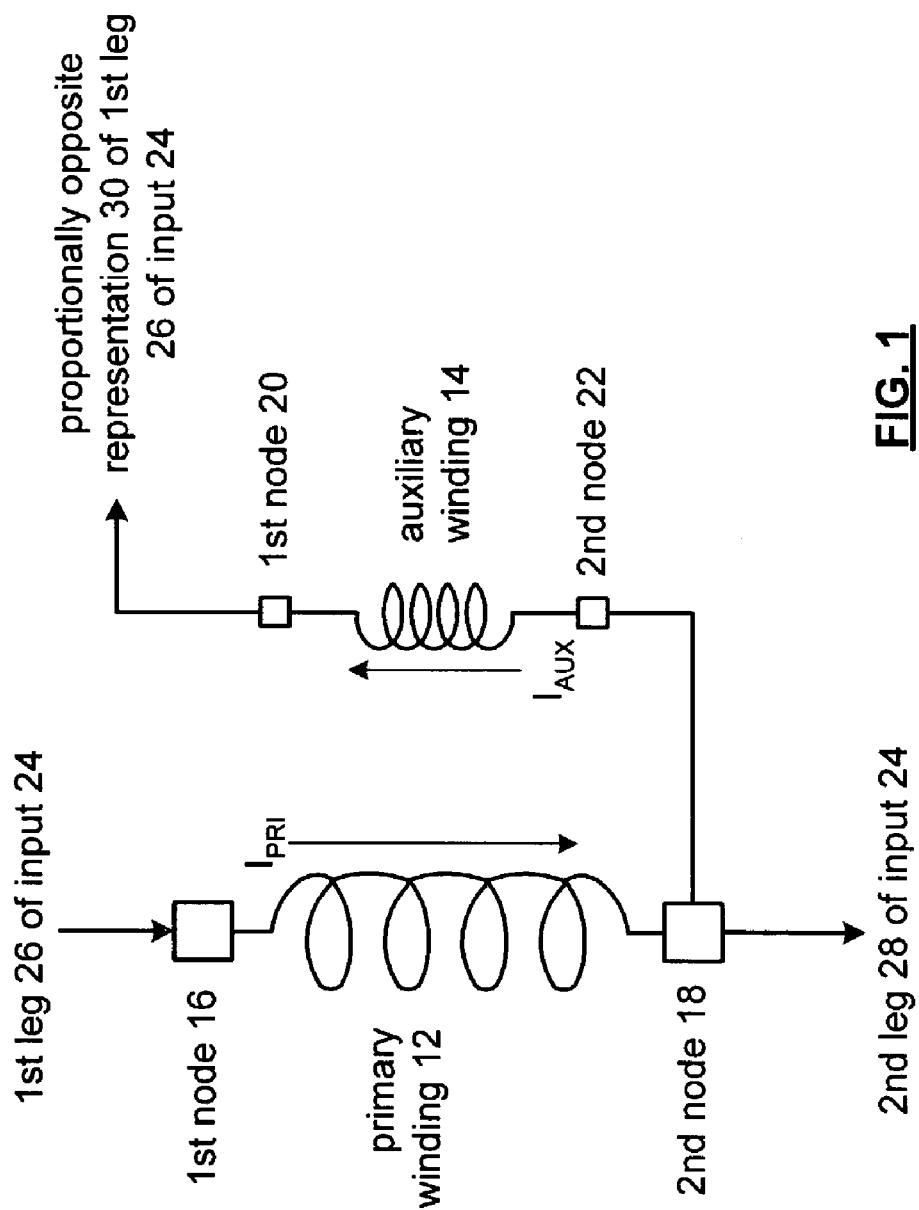
FIG. 1 high-Q on-chip inductor 10

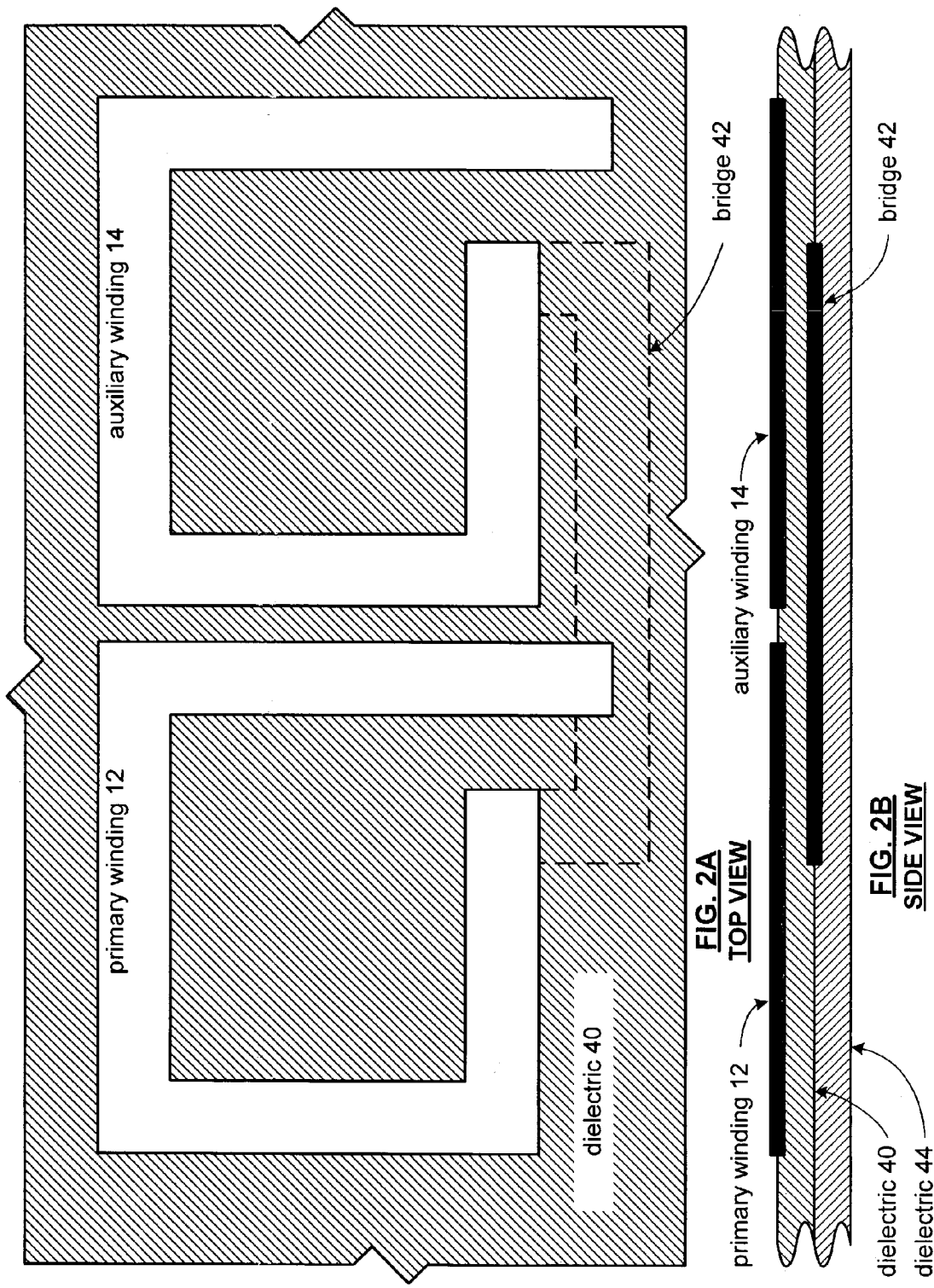

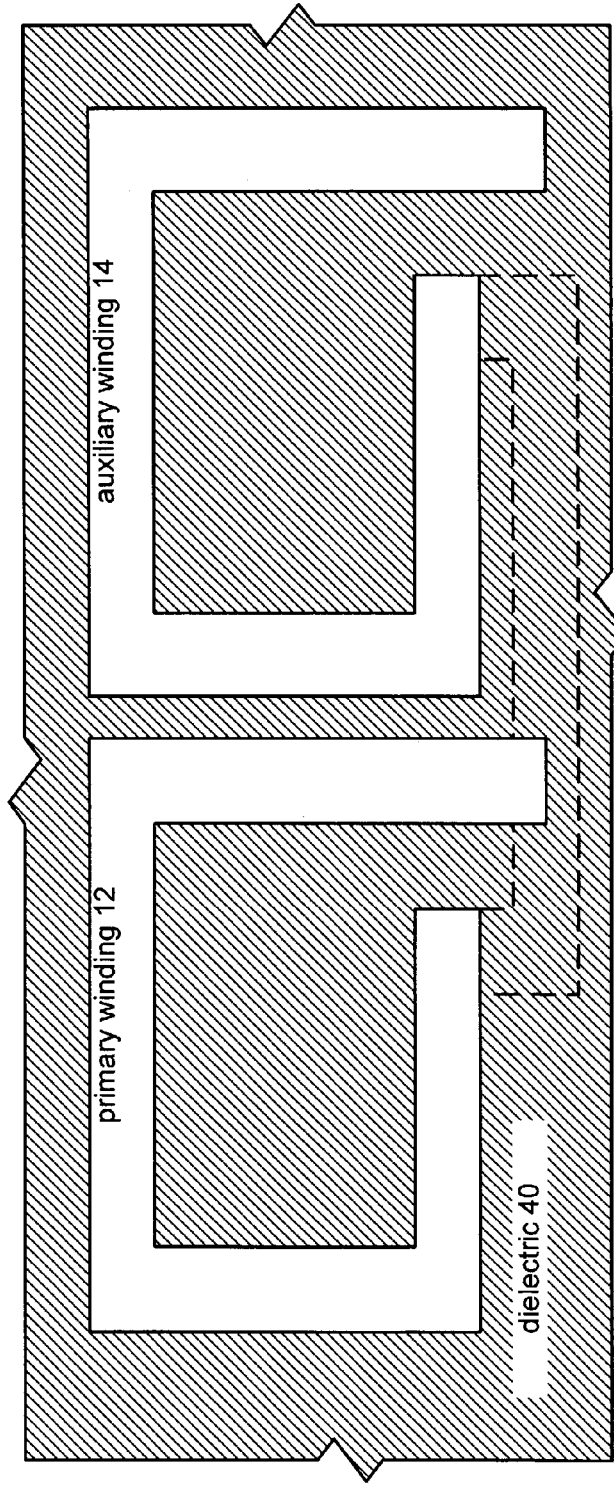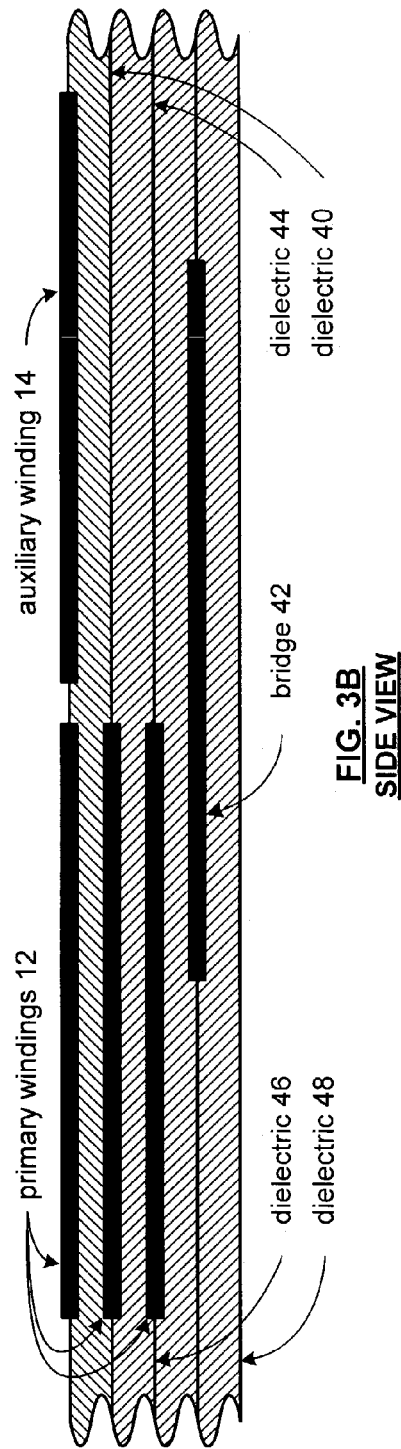
FIG. 3A TOP VIEW
FIG. 3B SIDE VIEW

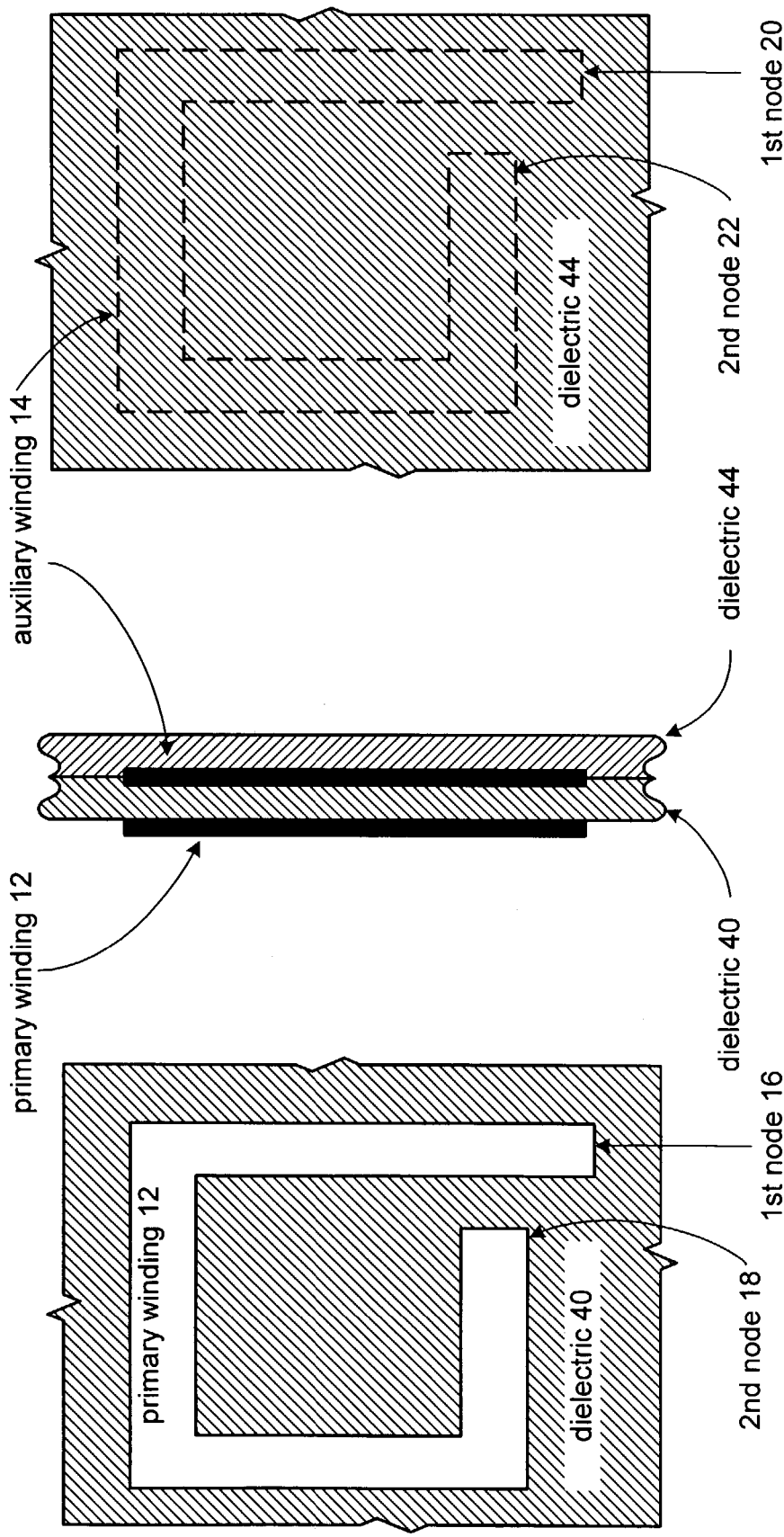

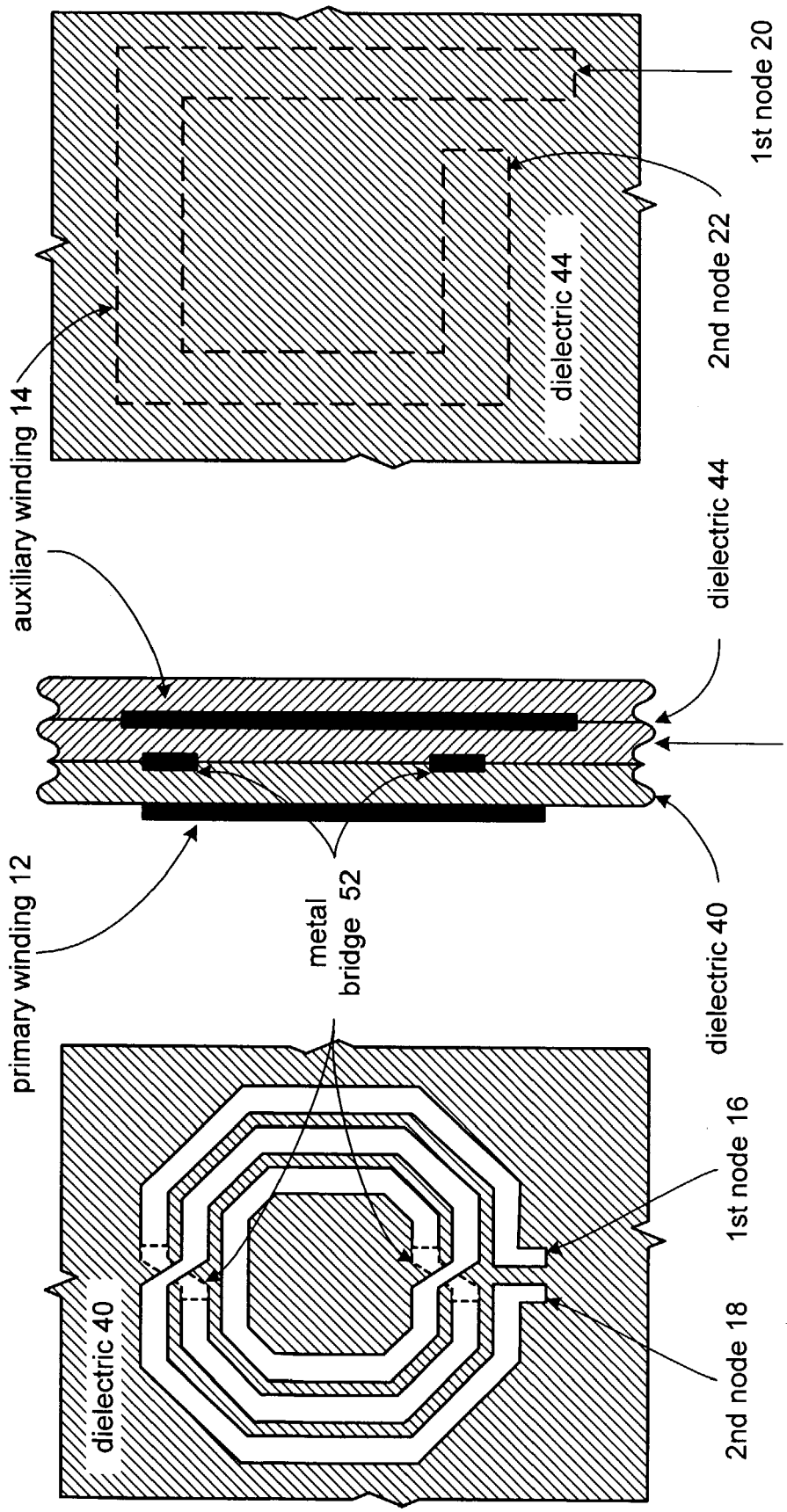

TOP VIEW

SIDE VIEW

METHOD OF MANUFACTURING HIGH Q ON-CHIP INDUCTOR

This patent application is a DIVISION and is claiming priority under 35 USC §121 to a patent application entitled HIGH Q ON-CHIP INDUCTOR AND METHOD OF MANUFACTURE THEREOF, having a of Ser. No. 10/087,614 and a filing date of Mar. 1, 2002 U.S. Pat. No. 6,809,623.

TECHNICAL FIELD OF THE INVENTION

This invention relates generally to integrated circuits and more particularly to on-chip inductors.

BACKGROUND OF THE INVENTION

As is known, wireless communications standards place stringent requirements on a wireless communication device's dynamic range of operation because the signal strength of received signals may vary by many orders of magnitude. To meet these requirements, wireless communication devices are designed using radio frequency (RF) integrated circuits (IC) that consume low power and produce little noise. As is also known, on-chip inductors are significant components of RF integrated circuits and are used in oscillators, impedance matching networks, emitter degeneration circuits, filters, and/or baluns. Thus, it is desirable to use on-chip inductors that consume as little power as possible and produce as little noise as possible.

As is further known, inductor performance is expressed as a quality factor (Q-factor), which is associated with the resonance of the inductor and describes both the ability of the inductor to produce a large output at the resonant frequency and the selectivity (i.e., the power ratio in decibels versus frequency) of the inductor. As such, the Q-factor is a key component in determining power dissipation and phase noise of integrated circuits. In general, inductors having a high Q-factor dissipate less power and thus improve the achievable gain. Further, high Q inductors allow an oscillating circuit to perform with minimal power injection from the driving transistor and hence minimize noise.

In addition, high Q inductors minimize the power leaking into adjacent channels that corrupts a receiver performance in nearby channels of communication chips, which degrade a receiver's sensitivity. Furthermore, higher dynamic range of wireless communication devices is obtained due to the intrinsic linearity of passive devices.

Not surprisingly, high Q inductors are a key element for RF integrated circuits to have low power consumption and to achieve the desired noise performance. While performance of wireless communication devices is a critical design issue it is typically balanced with manufacturing costs of the devices.

As is known, CMOS technology is widely used for cost effective fabrication of integrated circuits, including RF integrated circuits. However, on-chip inductors using CMOS technology are known to have a modest quality factor in the range of 5 to 10, which limit their usefulness is applications that require a high Q inductor, including some wireless communication applications.

Therefore, needs exist for a high quality factor on-chip inductor for use in many applications including wireless communication applications.

SUMMARY OF THE INVENTION

The high Q on-chip inductor of the present invention substantially meats these needs and others. In general, the high Q on-chip inductor includes a primary winding and an auxiliary winding that is coupled to receive a proportionally opposite representation of an input of the primary winding (i.e., reversed biased). Further, the auxiliary winding has a real part of its admittance greater than the real part of the admittance of the primary winding thereby yielding an asymmetry in the admittances. As such, a push/pull mechanism is obtained in a 2-port system (e.g., $1^{st}$ and $2^{nd}$ nodes of the primary winding) that produces a large Q factor (e.g., at least 30) for an on-chip inductor.

Another embodiment of a high Q on-chip inductor includes the primary winding, the auxiliary winding, and a poly-silicon shield. The primary and secondary winding are as described in the preceding paragraph and are fabricated proximally located to a poly-silicon shield such that the quality factor of the primary winding increases at least 15 times that of the quality factor of current on-chip inductors (e.g., the quality factor is at least 150).

A further embodiment includes a primary winding, a primary auxiliary winding, a secondary winding, and a secondary auxiliary winding thus producing a high quality factor on-chip transformer. The secondary auxiliary winding is coupled to receive a proportionally opposite representation of the signal of the secondary winding. Further, the secondary auxiliary winding has a real part of its admittance greater than the real part of the admittance of the secondary winding thereby yielding an asymmetry in the admittances.

In any of the embodiments, the number of turns comprising the winding (e.g., primary, auxiliary, secondary, and/or secondary auxiliary) may vary depending on the inductance needed, a desired Q factor, various winding shapes (e.g., square, rectangular, spiral, etc.) and/or a desired turns ratio. In addition, the number of layers on which the windings are created may also vary depending on the inductance needed, a desired Q factor, and/or a desired turns ratio.

BRIEF DESCRIPTION OF THE DRAWINGS

FIG. 1 illustrates a schematic block diagram of a high Q on-chip inductor in accordance with the present invention;

FIGS. 2A and 2B illustrate a top and side view of an on-chip inductor in accordance with the present invention;

FIGS. 3A and 3B illustrate a top and side view of an altering embodiment of an on-chip inductor in accordance with the present invention;

FIGS. 4A, 4B and 4C illustrate another embodiment of an on-chip inductor in accordance with the present invention;

FIGS. 5A, 5B and 5C illustrate yet another embodiment of an on-chip inductor in accordance with the present invention;

DETAIL DESCRIPTION OF A PREFERRED EMBODIMENT

Figures 6A, 6B:
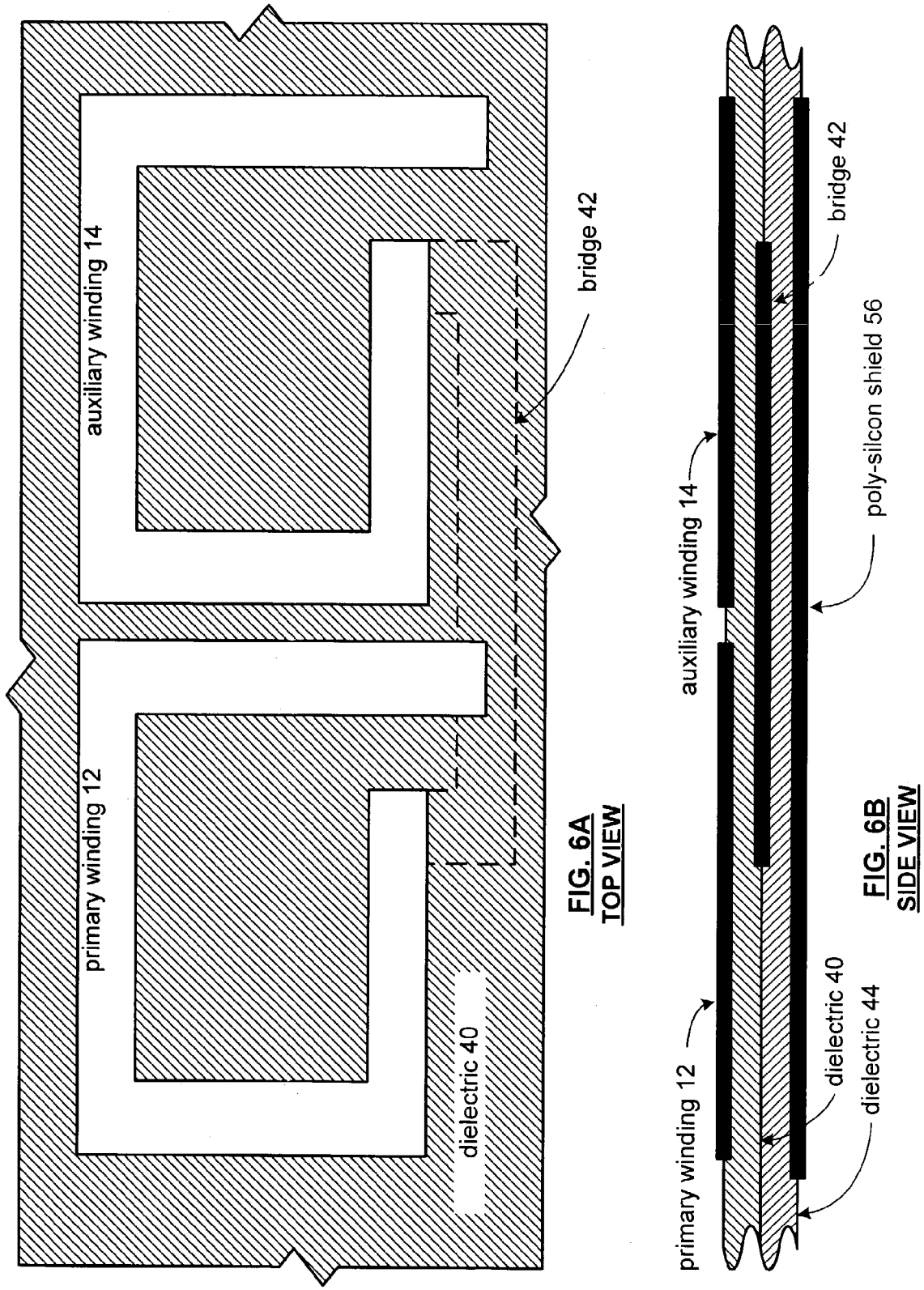
FIGS. 6A and 6B illustrate a further embodiment of an on-chip inductor in accordance with the present invention.

FIG. 1 illustrates a schematic block diagram of a high Q (i.e., quality factor) on-chip inductor 10 that includes a primary winding 12 and an auxiliary winding 14, which may be fabricated using CMOS technology, gallium arsenide technology, silicon germanium technology, or any other type of integrated circuit technology. The primary winding 12 includes a $1^{st}$ node 16 and a $2^{nd}$ node 18. The auxiliary winding 14 includes a $1^{st}$ node 20 and a $2^{nd}$ node 22. As shown, the $2^{nd}$ node 18 of primary winding 12 is coupled to the $2^{nd}$ node 22 of the auxiliary winding 14. The $1^{st}$ node 16 and $2^{nd}$ node 18 of primary winding 12 are operably coupled to receive a $1^{st}$ leg 26 and $2^{nd}$ leg 28 of an input 24, respectively. As such, a current ($I_{PRI}$) flows through the primary winding 12 based on the magnitude of the input 24 imposed across the $1^{st}$ node 16 and $2^{nd}$ node 18 and the inductance value of the primary winding. As one of average skill in the art will appreciate, the input 24 may be a voltage input or a current input.

The $1^{st}$ node 20 of auxiliary winding 14 is operably coupled to receive a proportionally opposite representation 30 of the $1^{st}$ leg 26 of input 24 (i.e., is reversed biased with respect to the primary winding). As such, the auxiliary winding 14 has a current ($I_{AUX}$) that is proportionally opposite to the current through the primary winding 12. If the proportionally opposite representation 30 is of the same magnitude as the $1^{st}$ leg of input 24 and the auxiliary winding 14 includes the same number of turns as primary winding 12, the auxiliary current will have the same magnitude as the primary current. As one of average skill in the art will appreciate, by scaling the magnitude of the proportionally opposite representation 30 and/or by changing the number of turns in the auxiliary winding 14 with respect to the number of turns in primary winding 12, the auxiliary current may be greater than or less than the primary current.

As configured, the auxiliary winding 14 is asymmetrical with respect to the primary winding 12 and has a greater real part admittance (i.e., the inverse of impedance of the winding at an operating frequency) than the real part of the admittance of the primary winding 12.

The asymmetry between the primary winding 12 and auxiliary winding 14 may be achieved by one or more of: asymmetrical electromagnetic coupling between the primary winding and auxiliary winding; an asymmetrical number of turns between the primary winding and auxiliary winding; an asymmetrical geometric configuration of the primary and auxiliary windings.

The admittances of both the primary winding 12 and auxiliary winding 14 include self-admittance and coupled-admittance. The magnitude of the admittances is dependent on the proximal location of the auxiliary winding to the primary winding and the asymmetry between the windings. Accordingly, the more closely coupled the auxiliary winding 14 is to the primary winding 12 and the more asymmetrical the windings are, the greater the difference will be in the real parts of the admittances of the primary winding 12 and the auxiliary winding 14. Such a difference effectively decreases the real part of the primary winding's admittance at an operating frequency (e.g., 2.5 gigahertz to 6 gigahertz), which increases the quality factor of the primary winding. For example, the primary winding 12 may have a quality factor of at least 30 using CMOS technology.

As one of average skill in the art will appreciate, the high quality factor on-chip inductor 10 may be a differential inductor having an imbalanced differential input, wherein one half of the differential inductor functions as the primary winding and the other half functions as the auxiliary winding.

FIGS. 2A and 2B illustrate a top and side view of the high Q on-chip inductor 10. As shown, the primary winding 12 and auxiliary winding 14 are deposited and/or etched on dielectric layer 40. The $2^{nd}$ node of primary winding 12 is operably coupled to the $2^{nd}$ node of auxiliary winding 14 via a bridge 42. The bridge may be formed on a $2^{nd}$ dielectric layer 44. In this configuration, the asymmetrical coupling of the auxiliary winding 14 to the primary winding 12 creates at least a part of the asymmetry between the admittance of the windings 12 and 14.

FIGS. 3A and 3B illustrate a top and side view of a high Q on-chip inductor that includes a multi-layered and multi-winding primary winding 12 and auxiliary winding 14. As shown in this configuration, the primary winding 12 includes a plurality of windings, which may have one or more turns, on multiple dielectric layers. As shown, the primary winding includes three layers of one turn, on dielectric layer 40, dielectric layer 44 and dielectric layer 46. Dielectric layer 48 supports bridge 42, which couples the primary winding 12 to auxiliary winding 14. In this instance, the asymmetry is generated not only by reversed biased electromagnetic coupling but also by an asymmetry in the number of turns between the primary and secondary windings. As one of average skill in the art will appreciate, the primary winding 12 may have one or more turns on each of the dielectric layers. In addition, the number of dielectric layers and/or turns may vary from those illustrated in FIGS. 3A and 3B.

FIGS. 4A, B, and C illustrate an alternate embodiment of an on-chip inductor that includes the primary winding 12 on dielectric layer 40 and auxiliary winding 14 on a $2^{nd}$ dielectric layer 44. In this instance, the electromagnetic coupling between the auxiliary winding 14 and primary winding 12 is increased. Such an increase in reverse biased electromagnetic coupling, increases the asymmetry, and thus increases the quality factor of primary winding 12. Note that the primary winding 12 and auxiliary winding 14 may each include one or more turns and may be implemented on one or more layers.

FIGS. 5A through 5C illustrate a top, side and bottom view of another alternate embodiment of a high Q on-chip inductor. In this illustration, the primary winding 12 includes multiple turns on dielectric layer 40. On dielectric layer 54, metal bridges 52 are placed to provide coupling within the primary winding 12. The auxiliary winding 14 is on dielectric layer 44. As such, the asymmetry is at least partially achieved via the differing number of turns as well as the reversed biased electromagnetic coupling. As one of average skill in the art will appreciate, the primary winding may include more or less turns than shown in FIG. 5A and may be included on one or more layers. In addition, the auxiliary winding 14 may include more than one turn and may be implemented on more than one dielectric layer.

FIGS. 6A and 6B illustrate yet another alternate embodiment of a high Q on-chip inductor. In this embodiment, the primary winding 12 and auxiliary winding 14 are on dielectric layer 40. The bridge 42 connects the primary winding 12 to the auxiliary winding 14. In this embodiment, underneath dielectric layer 44 is a poly-silicon shield 56. The poly-silicon shield 56 is configured in a stacked geometry and further increases the quality factor. For example, in one embodiment of an on-chip inductor using CMOS technology, the quality factor may be increased to as much as 150. As one of average skill in the art will appreciate, the number of turns of the primary windings 12 and of the auxiliary windings 14 may vary from the one turn as shown in FIGS. 6A and 6B. In addition, the number of layers used to implement the primary winding 12 and/or auxiliary winding 14 may vary from the one shown in FIGS. 6A and 6B.

Figure 7:
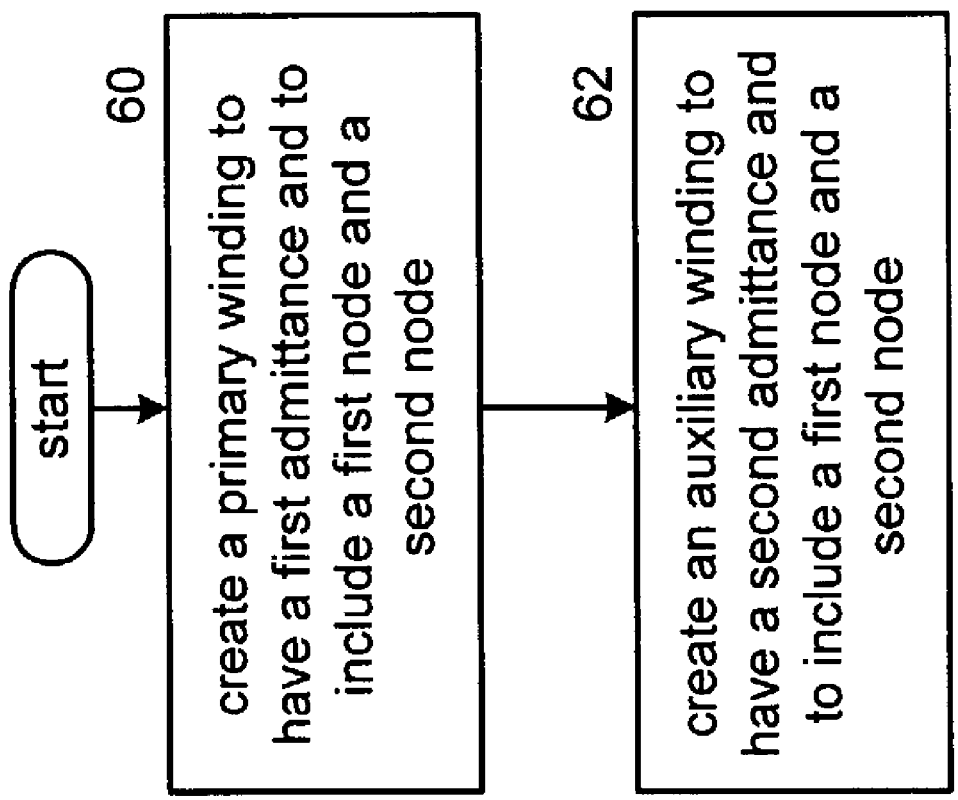
FIG. 7 illustrates a logic diagram of a method for manufacturing an on-chip inductor in accordance with the present invention.

FIG. 7 illustrates a logic diagram of a method of manufacturing a high quality on-chip inductor. The process begins at Step 60 where a primary winding is created to have a $1^{st}$ admittance and to include a $1^{st}$ and $2^{nd}$ node on a dielectric layer. The creation of the primary winding may be done by depositing, etching and/or any other method for obtaining a metal layer on a dielectric layer in an integrated circuit fabrication process. The process then proceeds to Step 62 where auxiliary winding is created to have a $2^{nd}$ admittance and to include a $1^{st}$ and $2^{nd}$ node. The $2^{nd}$ node of the primary winding is coupled to the $2^{nd}$ node of the auxiliary winding. In addition, the creation of the real part of the $2^{nd}$ admittance is done to be greater than the real part of the admittance of the primary winding. The primary winding is operably coupled to receive an input, while the auxiliary winding is operably coupled to receive a proportionally opposite representation of the input.

The admittance of the primary winding includes both self-admittance and coupled-admittance. Similarly, the admittance of the auxiliary winding includes self-admittance and coupled-admittance. The difference in the real parts of the admittance of both windings is dependent on the proximal location of the auxiliary winding to the primary winding and the asymmetry between the windings. The greater the coupling and asymmetry between the auxiliary winding and primary winding, the lower the real portion of the primary winding admittance will be, thus increasing the quality factor for the primary winding.

The asymmetry between the auxiliary winding the primary winding may be done by asymmetrical electrical coupling between the primary winding and auxiliary winding, differing number of turns in the primary winding versus the number of turns in the auxiliary winding, and/or by creating the primary winding to have a different geometric configuration than that of the auxiliary winding.

The quality factor of the primary winding may be enhanced by creating a poly-silicon shield that is operably coupled to the primary winding and the auxiliary winding. As one of average skill in the art will appreciate, the primary winding and/or auxiliary winding may be created to have multiple turns on multiple layers and/or a single turn on a single layer and/or any combination thereof.

The preceding discussion has presented a high quality on-chip inductor. Such a high quality on-chip inductor dramatically increases the quality factor of inductors thus making it very applicable for a wide variety of circuit applications including radio frequency integrated circuits, on-chip filters, et cetera. As one of average skill in the art will appreciate, other embodiments may be derived from the teachings of the present invention, without deviating from the scope of the claims.

What is claimed is:

1. A method for manufacturing a high-Q on-chip inductor comprises:

creating a primary winding to include a first node and a second node, wherein the primary winding has a first admittance; and creating an auxiliary winding to include a first node and a second node, wherein the auxiliary winding has a second admittance, wherein the second node of the primary winding is coupled to the second node of the auxiliary winding, wherein the second admittance is greater than the first admittance, wherein the first node of the primary winding is operably coupled to receive a first leg of an input, wherein the second node of the primary winding is coupled to receive a second leg of the input, and wherein the first node of the auxiliary winding is coupled to receive a proportionally opposite representation of the first leg of the input.

2. The method of claim 1 further comprises:

creating the primary winding to have the first admittance that includes first self admittance and first coupled admittance; and creating the auxiliary winding to have the second admittance that includes second self admittance and second coupled admittance.

3. The method of claim 2 further comprises:

creating the auxiliary winding to be proximally located to the primary winding such that at least part of the first and second coupled admittances are established.

4. The method of claim 2 further comprises:

creating the auxiliary winding to be asymmetric with respect to the primary winding such that the second admittance is greater than the first admittance.

5. The method of claim 4 further comprises creating the asymmetry by at least one of:

asymmetrical electromagnetic coupling the primary winding to the auxiliary winding;

creating number of turns of the primary winding to be different than a number of turns of the auxiliary winding; and creating the primary winding to have different geometric configuration than the auxiliary winding.

6. The method of claim 1 further comprises:

creating a polysilicon shield that is operably coupled to the primary winding and to the auxiliary winding.

7. The method of claim 1 further comprises:

creating the primary winding to include a plurality of turns on multiple dielectric layers of an integrated circuit, coupling the plurality of turns via bridges on differing dielectric layers of the integrated circuit; and creating the auxiliary winding including at least one turn on at least one of the multiple dielectric layers of the integrated circuit.

8. The method of claim 1 further comprises:

creating the primary winding to include at least one turn on a first dielectric layer of an integrated circuit; and creating the auxiliary winding to include at least one turn on a second dielectric layer of the integrated circuit in a stacked configuration with respect to the at least one turn of the primary winding.

9. A method for manufacturing a high-Q on-chip inductor comprises:

creating a primary winding to include a first node and a second node; and creating an auxiliary winding operably coupled to increase a quality factor of the primary winding.

10. The method of claim 9 further comprises:

creating the auxiliary winding to be proximally located to, and reversed biased with respect to, the primary winding such that an admittance of the auxiliary winding is greater than an admittance of the primary winding.

11. The method of claim 9 further comprises:

creating the auxiliary winding to be asymmetric with respect to the primary winding to at least partially establish an admittance of the auxiliary winding being greater than an admittance of the primary winding.

12. The method of claim 11 further comprises creating the asymmetry by at least one of:

asymmetrical electromagnetic coupling the primary winding to the auxiliary winding;

creating the primary winding to have a differing number of turns than a number of turns of the auxiliary winding; and creating the primary winding to have an asymmetrical geometric configuration with respect to the auxiliary winding.

13. The method of claim 9 further comprises:

creating a poly-silicon shield operably coupled to the primary winding and to the auxiliary winding.

14. The method of claim 9 further comprises:

creating the primary winding to include a plurality of turns on multiple dielectric layers of an integrated circuit;

connecting the plurality of turns of the primary winding using bridges on differing dielectric layers of the integrated circuit; and creating the auxiliary winding to include at least one turn on at least one of the multiple dielectric layers of the integrated circuit.

15. The method of claim 9 further comprises:

creating the primary winding to include at least one turn on a first dielectric layer of an integrated circuit; and creating the auxiliary winding to include at least one turn on a second dielectric layer of the integrated circuit in a stacked configuration with respect to the at least one turn of the primary winding.

* * * * *

UNITED STATES PATENT AND TRADEMARK OFFICE
CERTIFICATE OF CORRECTION

PATENT NO. : 7,032,292 B2
APPLICATION NO. : 10/395568
DATED : April 25, 2006
INVENTOR(S) : Sissy Kyriazidou et al.

It is certified that error appears in the above-identified patent and that said Letters Patent is hereby corrected as shown below:

Column 6, line 30, in Claim 6: replace "polysilicon" with --poly-silicon--

Signed and Sealed this

Nineteenth Day of August, 2008

JON W. DUDAS
*Director of the United States Patent and Trademark Office*